(12) United States Patent
Ahuja et al.

(10) Patent No.: US 7,371,005 B1
(45) Date of Patent: May 13, 2008

(54) AUTOMATIC CIRCUIT AND METHOD FOR TEMPERATURE COMPENSATION OF OSCILLATOR FREQUENCY VARIATION OVER TEMPERATURE FOR A REAL TIME CLOCK CHIP

(75) Inventors: Bhupendra K. Ahuja, Fremont, CA (US); Hoa Vu, Milpitas, CA (US); Teck-Boon Serm, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/818,387

(22) Filed: Jun. 14, 2007

Related U.S. Application Data

(60) Provisional application No. 60/869,683, filed on Dec. 12, 2006, provisional application No. 60/859,396, filed on Nov. 16, 2006.

(51) Int. Cl.
G04B 17/20 (2006.01)
H03L 1/00 (2006.01)
(52) U.S. Cl. ........ 368/202; 331/176
(58) Field of Classification Search ........ 368/10, 368/156, 200–202; 331/176
See application file for complete search history.

(56) References Cited

U.S. PATENT DOCUMENTS

| | | | | |
|---|---|---|---|---|
| 4,922,212 A | * | 5/1990 | Roberts et al. | 331/176 |
| 5,473,289 A | * | 12/1995 | Ishizaki et al. | 331/176 |
| 5,548,252 A | * | 8/1996 | Watanabe et al. | 331/176 |
| 5,668,506 A | * | 9/1997 | Watanabe et al. | 331/66 |
| 6,476,682 B1 | * | 11/2002 | Cole et al. | 331/176 |
| 6,819,194 B2 | * | 11/2004 | Toncich et al. | 331/158 |
| 2004/0124937 A1 | * | 7/2004 | Han et al. | 331/176 |

* cited by examiner

Primary Examiner—Vit W Miska
(74) Attorney, Agent, or Firm—Fogg & Powers LLC

(57) ABSTRACT

An automatic temperature compensated real-time clock (RTC) chip includes a clock portion having a crystal oscillator block including crystal compensation circuitry adapted to be coupled to a crystal. The crystal compensation circuitry includes a non-linear capacitor DAC including a plurality of load capacitors, wherein the load capacitors have respective switches which switch respective ones of the load capacitors to change a parallel resonance frequency (fp) generated by the oscillator block. The capacitor DAC is arranged so that Analog Trimming (ATR) bits received cause an arrangement of the switches to provide a non-linear change in overall load capacitance to result in a linear relationship between fp and the ATR bits. A temperature sensor block is coupled to the crystal for measuring a temperature of at least the crystal. An A/D converter is coupled to the temperature sensor for outputting a digital temperature signal representative of the temperature of the crystal. A DSP engine receives the digital temperature signal and calculates frequency correction needed to correct for frequency inaccuracy and determines a bit sequence including the ATR bits appropriate to achieve the frequency correction.

20 Claims, 18 Drawing Sheets

Temperature Drift: PPM Delta = - *Alpha* * (T − 25)^2
Typical *Alpha*=.034ppm/C^2     Parabolic Temp Characterstics.
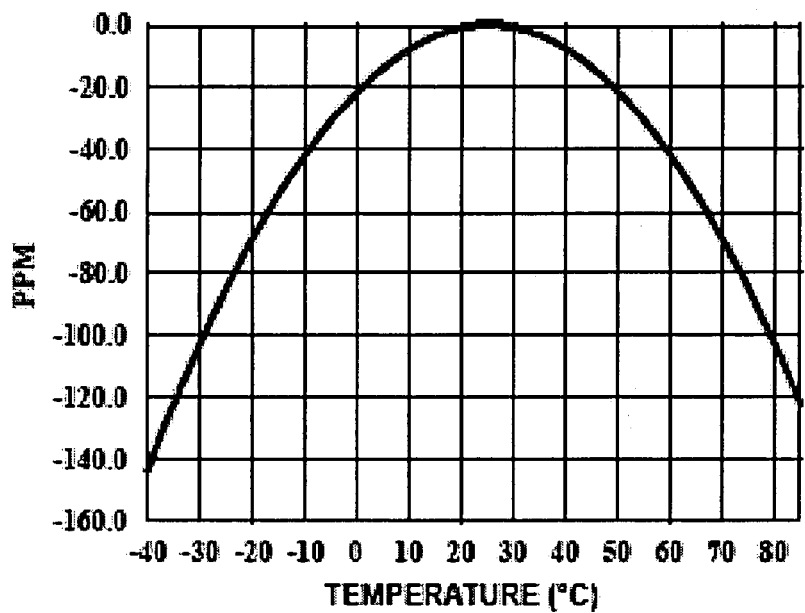
FIG. 1:     RTC CRYSTAL TEMPERATURE DRIFT
(PRIOR ART)

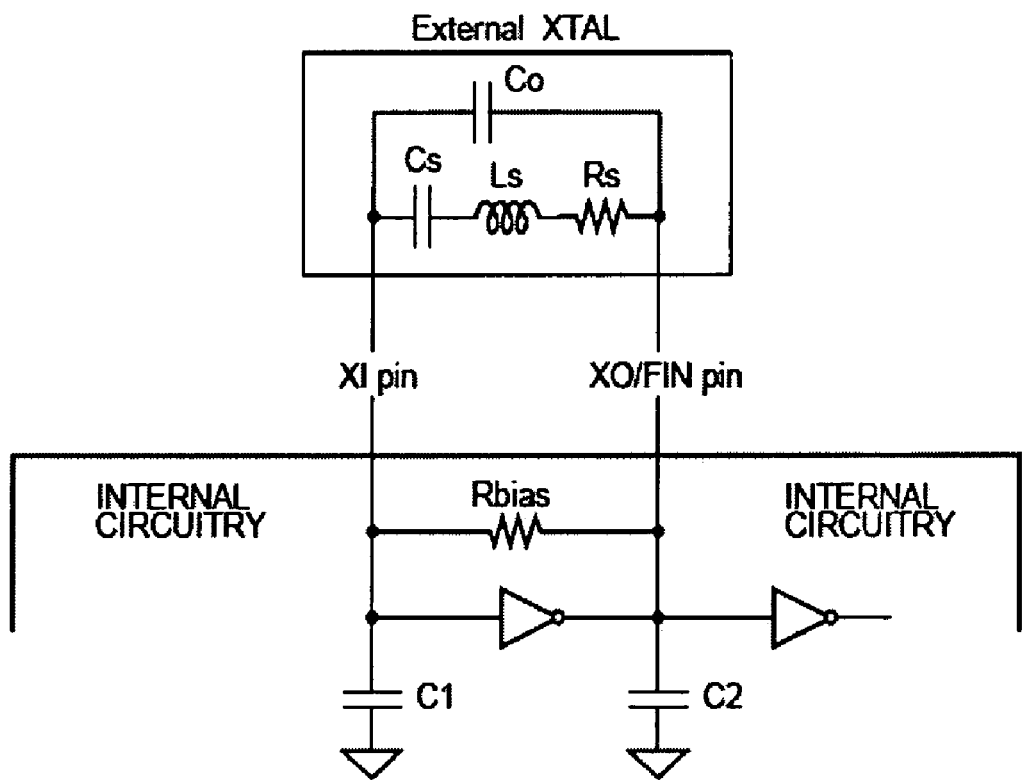
FIG. 2(a): PIERCE OSCILLATOR
(PRIOR ART)

Crystal Oscillator ATR $$fs = \frac{1}{2\pi\sqrt{L_s C_s}}$$

$$fp = fs\left[1 + \frac{C_s}{2(CL + C_o)}\right]$$

$$CL = \frac{CL1 * CL2}{CL1 + CL2}$$

The frequency can be varied by changing CL.

6-bit Thermometer Decoder

The detector generates controls for the switches associated with the capacitor DAC segments.

12 Capacitor DAC Segments
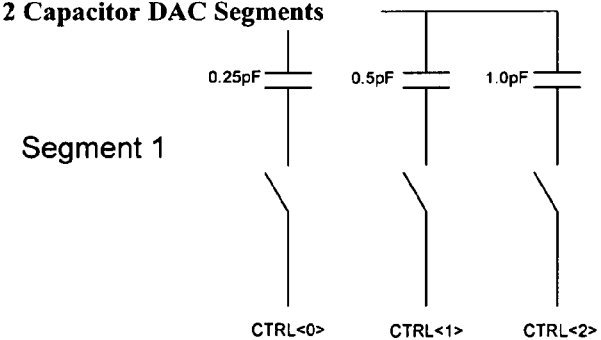
Segment 1
FIG. 5(b)
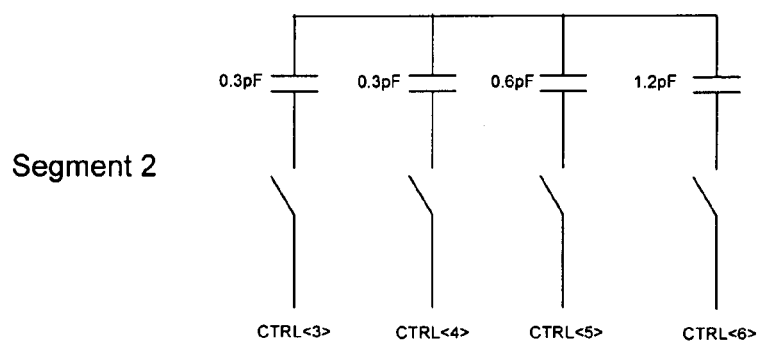
Segment 2
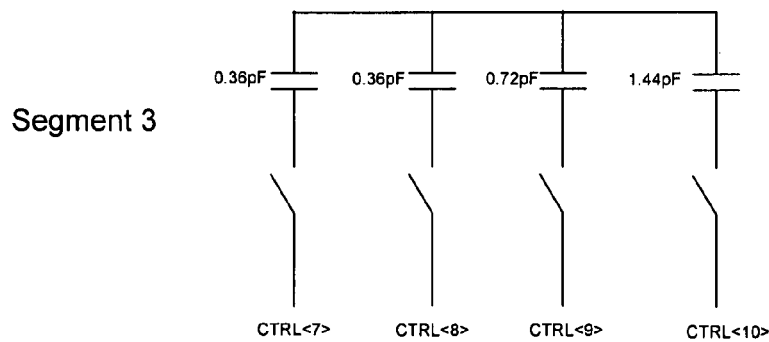
Segment 3
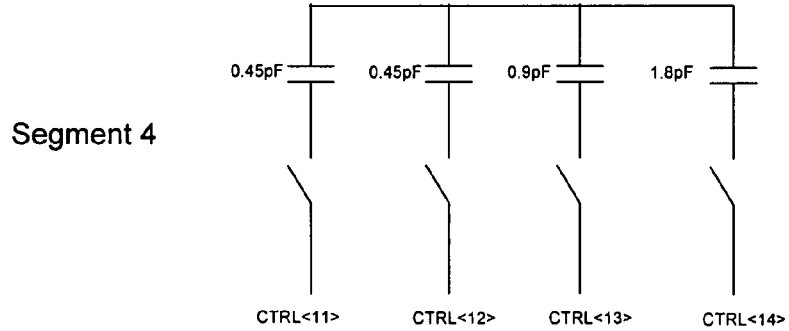
Segment 4

Segment 5 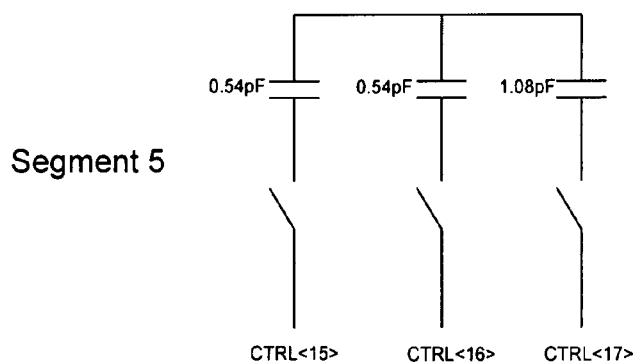
FIG. 5(b)
Segment 6 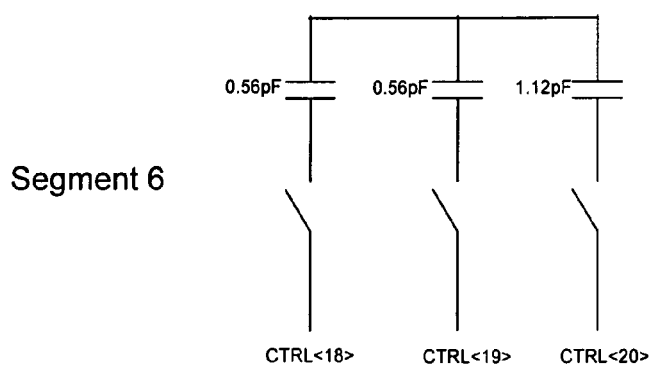
Segment 7 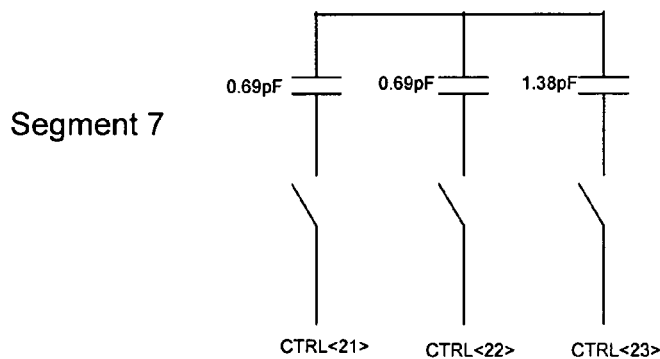
Segment 8 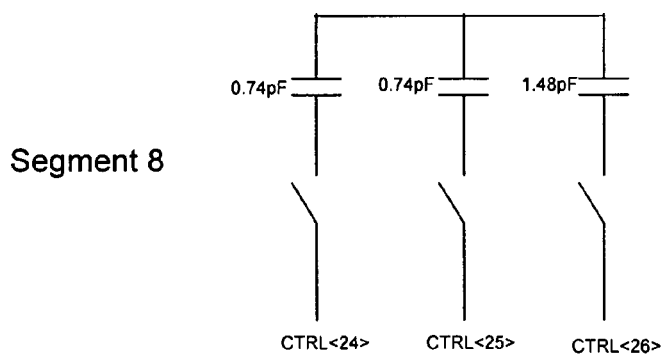

Segment 9
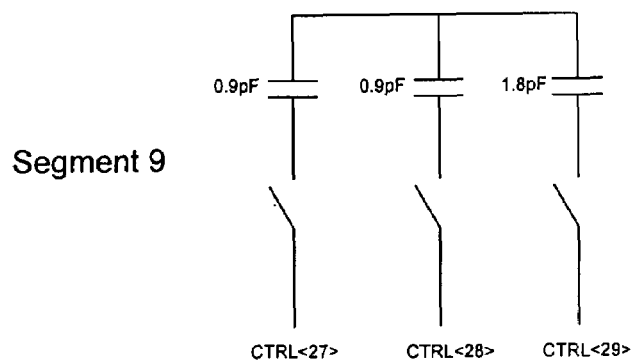
FIG. 5(b)
Segment 10
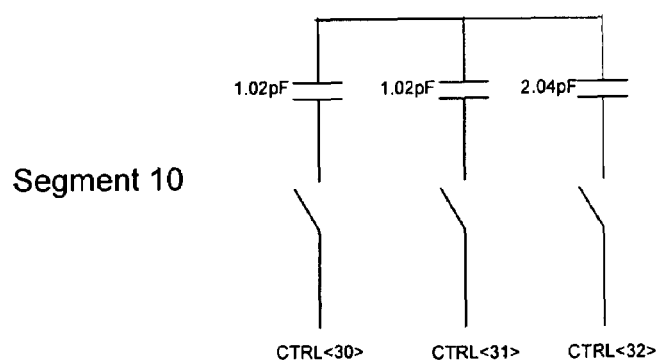
Segment 11
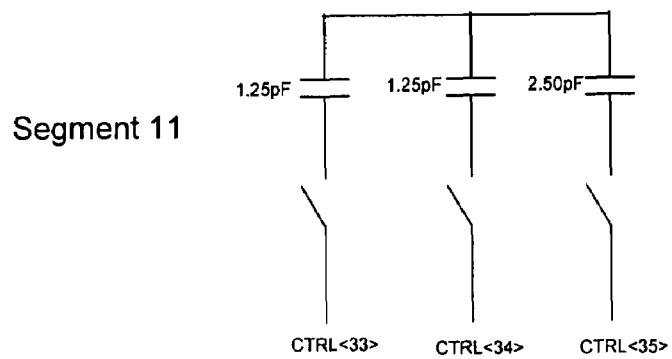
Segment 12
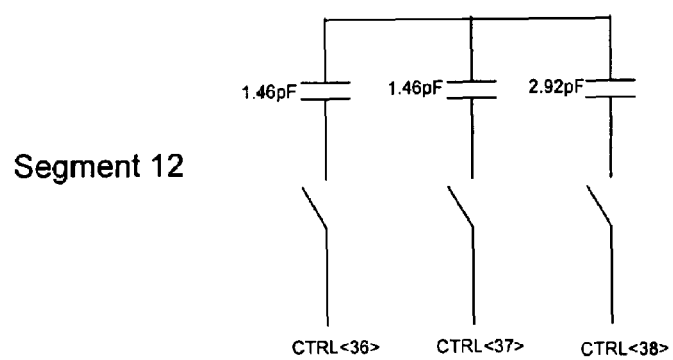

THE ATR trim is partitioned into 12 cap DACs.

| code | ATR5 | ATR4 | ATR3 | ATR2 | ATR1 | ATR0 | C2 | C1 | C0 | CL(pF) | delta CL(pF) | fp (Hz) |
|---|---|---|---|---|---|---|---|---|---|---|---|---|
| 0 | 0 | 0 | 0 | 0 | 0 | 0 | | | | 13.83 | 0 | 32769.220 |
| 1 | 0 | 0 | 0 | 0 | 0 | 1 | 1p | 500f | 250f | 14.06 | 0.238 | 32769.181 |
| 2 | 0 | 0 | 0 | 0 | 1 | 0 | | | | 14.31 | 0.481 | 32769.142 |
| 3 | 0 | 0 | 0 | 0 | 1 | 1 | | | | 14.55 | 0.729 | 32769.104 |
| 4 | 0 | 0 | 0 | 1 | 0 | 0 | | | | 14.81 | 0.982 | 32769.065 |
| 5 | 0 | 0 | 0 | 1 | 0 | 1 | | | | 15.07 | 1.241 | 32769.026 |
| 6 | 0 | 0 | 0 | 1 | 1 | 0 | | | | 15.33 | 1.505 | 32768.988 |
| 7 | 0 | 0 | 0 | 1 | 1 | 1 | | | | 15.60 | 1.775 | 32768.949 |
| 8 | 0 | 0 | 1 | 0 | 0 | 0 | 1.2p | 600f | 300f | 15.88 | 2.051 | 32768.910 |
| 9 | 0 | 0 | 1 | 0 | 0 | 1 | | | | 16.16 | 2.333 | 32768.872 |
| 10 | 0 | 0 | 1 | 0 | 1 | 0 | | | | 16.45 | 2.621 | 32768.834 |
| 11 | 0 | 0 | 1 | 0 | 1 | 1 | | | | 16.74 | 2.917 | 32768.795 |
| 12 | 0 | 0 | 1 | 1 | 0 | 0 | | | | 17.04 | 3.219 | 32768.757 |
| 13 | 0 | 0 | 1 | 1 | 0 | 1 | | | | 17.35 | 3.528 | 32768.719 |
| 14 | 0 | 0 | 1 | 1 | 1 | 0 | | | | 17.67 | 3.844 | 32768.680 |
| 15 | 0 | 0 | 1 | 1 | 1 | 1 | | | | 17.99 | 4.168 | 32768.642 |
| 16 | 0 | 1 | 0 | 0 | 0 | 0 | 1.44p | 720f | 360f | 18.33 | 4.500 | 32768.604 |
| 17 | 0 | 1 | 0 | 0 | 0 | 1 | | | | 18.67 | 4.840 | 32768.566 |
| 18 | 0 | 1 | 0 | 0 | 1 | 0 | | | | 19.01 | 5.189 | 32768.528 |
| 19 | 0 | 1 | 0 | 0 | 1 | 1 | | | | 19.37 | 5.546 | 32768.490 |
| 20 | 0 | 1 | 0 | 1 | 0 | 0 | | | | 19.74 | 5.913 | 32768.452 |
| 21 | 0 | 1 | 0 | 1 | 0 | 1 | | | | 20.11 | 6.289 | 32768.414 |
| 22 | 0 | 1 | 0 | 1 | 1 | 0 | | | | 20.50 | 6.674 | 32768.376 |
| 23 | 0 | 1 | 0 | 1 | 1 | 1 | | | | 20.90 | 7.071 | 32768.338 |
| 24 | 0 | 1 | 1 | 0 | 0 | 0 | 1.8p | 900f | 450f | 21.30 | 7.477 | 32768.301 |
| 25 | 0 | 1 | 1 | 0 | 0 | 1 | | | | 21.72 | 7.895 | 32768.263 |
| 26 | 0 | 1 | 1 | 0 | 1 | 0 | | | | 22.15 | 8.325 | 32768.225 |
| 27 | 0 | 1 | 1 | 0 | 1 | 1 | | | | 22.59 | 8.766 | 32768.188 |
| 28 | 0 | 1 | 1 | 1 | 0 | 0 | | | | 23.05 | 9.221 | 32768.150 |
| 29 | 0 | 1 | 1 | 1 | 0 | 1 | | | | 23.51 | 9.688 | 32768.112 |
| 30 | 0 | 1 | 1 | 1 | 1 | 0 | | | | 23.99 | 10.169 | 32768.075 |
| 31 | 0 | 1 | 1 | 1 | 1 | 1 | | | | 24.49 | 10.664 | 32768.037 |
| 32 | 1 | 0 | 0 | 0 | 0 | 0 | | 1.08p | 540f | 25.00 | 11.175 | 32768 |
| 33 | 1 | 0 | 0 | 0 | 0 | 1 | | | | 25.51 | 11.685 | 32767.964 |
| 34 | 1 | 0 | 0 | 0 | 1 | 0 | | | | 26.04 | 12.211 | 32767.927 |
| 35 | 1 | 0 | 0 | 0 | 1 | 1 | | | | 26.58 | 12.752 | 32767.891 |
| 36 | 1 | 0 | 0 | 1 | 0 | 0 | | 1.12p | 560f | 27.14 | 13.311 | 32767.855 |
| 37 | 1 | 0 | 0 | 1 | 0 | 1 | | | | 27.71 | 13.886 | 32767.819 |
| 38 | 1 | 0 | 0 | 1 | 1 | 0 | | | | 28.31 | 14.480 | 32767.783 |
| 39 | 1 | 0 | 0 | 1 | 1 | 1 | | | | 28.92 | 15.093 | 32767.747 |
| 40 | 1 | 0 | 1 | 0 | 0 | 0 | | 1.38p | 690f | 29.55 | 15.726 | 32767.711 |
| 41 | 1 | 0 | 1 | 0 | 0 | 1 | | | | 30.21 | 16.380 | 32767.675 |
| 42 | 1 | 0 | 1 | 0 | 1 | 0 | | | | 30.88 | 17.056 | 32767.639 |
| 43 | 1 | 0 | 1 | 0 | 1 | 1 | | | | 31.58 | 17.756 | 32767.604 |
| 44 | 1 | 0 | 1 | 1 | 0 | 0 | | 1.48p | 740f | 32.30 | 18.480 | 32767.568 |
| 45 | 1 | 0 | 1 | 1 | 0 | 1 | | | | 33.05 | 19.229 | 32767.532 |
| 46 | 1 | 0 | 1 | 1 | 1 | 0 | | | | 33.83 | 20.006 | 32767.497 |
| 47 | 1 | 0 | 1 | 1 | 1 | 1 | | | | 34.64 | 20.811 | 32767.461 |

FIG. 6(a)

| code | ATR5 | ATR4 | ATR3 | ATR2 | ATR1 | ATR0 | C2 | C1 | C0 | CL(pF) | delta CL(pF) | fp (Hz) |
|---|---|---|---|---|---|---|---|---|---|---|---|---|
| 48 | 1 | 1 | 0 | 0 | 0 | 0 | | 1.8p | 900f | 35.47 | 21.647 | 32767.426 |
| 49 | 1 | 1 | 0 | 0 | 0 | 1 | | | | 36.34 | 22.514 | 32767.391 |
| 50 | 1 | 1 | 0 | 0 | 1 | 0 | | | | 37.24 | 23.416 | 32767.355 |
| 51 | 1 | 1 | 0 | 0 | 1 | 1 | | | | 38.18 | 24.353 | 32767.320 |
| 52 | 1 | 1 | 0 | 1 | 0 | 0 | | 2.04p | 1.02p | 39.15 | 25.328 | 32767.285 |
| 53 | 1 | 1 | 0 | 1 | 0 | 1 | | | | 40.17 | 26.343 | 32767.250 |
| 54 | 1 | 1 | 0 | 1 | 1 | 0 | | | | 41.23 | 27.402 | 32767.214 |
| 55 | 1 | 1 | 0 | 1 | 1 | 1 | | | | 42.33 | 28.506 | 32767.179 |
| 56 | 1 | 1 | 1 | 0 | 0 | 0 | | 2.50p | 1.25p | 43.48 | 29.658 | 32767.144 |
| 57 | 1 | 1 | 1 | 0 | 0 | 1 | | | | 44.69 | 30.862 | 32767.110 |
| 58 | 1 | 1 | 1 | 0 | 1 | 0 | | | | 45.95 | 32.122 | 32767.075 |
| 59 | 1 | 1 | 1 | 0 | 1 | 1 | | | | 47.27 | 33.441 | 32767.040 |
| 60 | 1 | 1 | 1 | 1 | 0 | 0 | | 2.92p | 1.46p | 48.65 | 34.823 | 32767.005 |
| 61 | 1 | 1 | 1 | 1 | 0 | 1 | | | | 50.10 | 36.274 | 32766.971 |
| 62 | 1 | 1 | 1 | 1 | 1 | 0 | | | | 51.62 | 37.798 | 32766.936 |
| 63 | 1 | 1 | 1 | 1 | 1 | 1 | | | | 53.23 | 39.401 | 32766.901 |

FIG. 6(a)

AUTOMATIC CIRCUIT AND METHOD FOR TEMPERATURE COMPENSATION OF OSCILLATOR FREQUENCY VARIATION OVER TEMPERATURE FOR A REAL TIME CLOCK CHIP

CROSS-REFERENCE TO RELATED APPLICATIONS

This application claims the benefit of Provisional Application No. 60/859,396 filed on Nov. 16, 2006 and Provisional Application No. 60/869,683 filed on Dec. 12, 2006, both entitled "AUTOMATIC CIRCUIT AND METHOD FOR TEMPERATURE COMPENSATION OF OSCILLATOR FREQUENCY VARIATION OVER TEMPERATURE FOR A REAL TIME CLOCK CHIP", both being incorporated by reference in their entireties into the present application.

FIELD OF THE INVENTION

The invention relates to electronic devices, and, more particularly, to timekeeping devices useful in personal computers and other consumer electronics, as well as networking devices.

BACKGROUND OF THE INVENTION

Personal computers typically include a clock/calendar that tracks the time of day, day, month, and year. Such a clock/calendar has various uses such as time stamping files and inserting dates into documents, such as letters and e-mails both sent and received. The clock/calendar must be programmable for setting or changing the date or time of day. A clock/calendar is typically implemented in specific hardware with a dedicated crystal oscillator to insure accuracy and a battery backup power supply to insure preservation of timekeeping data during an interruption of the primary power supply. This is especially important with personal computers which are frequently powered down.

Crystals generally show frequency variation with temperature resulting into several hundred ppm shift in their nominal frequency. Most applications, in particular, a Real Time Clock (RTC), requires accuracy of the input clock to be within +/−5 ppm over a temperature range of −40 to 85° C. in order to provide accurate time information to the user.

An RTC with a 32.768 kHz quartz tuning-fork crystal oscillator is currently the standard timekeeping reference for most electronic applications. The RTC maintains the time and date by counting seconds, which requires an oscillator divider chain to derive a 1 Hz clock signal provided by the 32.768 kHz crystal oscillator. The current time and date information is stored in a set of registers, which is generally accessed through a communication interface.

Tuning fork type crystal oscillators are known to have both a frequency offset at room temperature and frequency variation over temperature, typically resulting into several hundred ppm frequency shift from their nominal frequency of 32.768 kHz. These frequency offsets can be broken into two portions, one being the initial frequency inaccuracy, with the other being the frequency fluctuation over temperature. The typical frequency stability of a crystal can be described by equation (1) below:

$$\Delta f = \Delta f_i + \alpha(T-T_{25})^2 \qquad (1)$$

Where $\Delta f$ is in the total frequency variation in ppm; $\Delta f_i$ is the initial frequency tolerance at 25° C., which usually within the range of ±32 ppm; $\alpha$ is the parabolic curvature constant of the crystal, for the commonly used quartz watch crystal, $\alpha$ has a typical value of 0.034 ppm/C$^2$ for quartz; T is temperature in Celsius and $T_{25}$ is 25° C. This parabolic frequency versus temperature characteristic is depicted in FIG. 1.

$\Delta f_i$ is the constant frequency offset due to the manufacturing quality issues and aging of the crystal. The value of the second term in equation 1, $\alpha(T-T_{25})^2$, is determined by $\alpha$ which is a characteristic of the particular crystalline material, and the operating temperature. Both terms combined could contribute to a frequency variation up to about 200 ppm. For an RTC, 100 ppm in the frequency variation implies that there is about 120 seconds (about 2 minutes) of error at the end of a month's time.

It is well known to use load capacitors to adjust the parallel resonance frequency, $f_0$, of crystal oscillators. This frequency, $f_0$, has an inverse square root relationship to load capacitor ($C_L$) changes. For on-chip load capacitor designs, some known designs use switched capacitor arrays controlled digitally by input code vectors. Such capacitor arrays are known as capacitor digital-to-analog converters (referred to as capacitor DACs, capacitive DACs or CDACs). A conventional capacitor DAC comprises of an array of N capacitors hooked in parallel with binary weighted values plus generally one "dummy LSB" capacitor. During the acquisition phase, the array's common terminal (the terminal at which all the capacitors share a connection) is connected to ground and all free terminals are connected to the input signal (Analog In or $V_{IN}$). After acquisition, the common terminal is disconnected from ground and the free terminals are disconnected from $V_{IN}$, effectively trapping a charge proportional to the input voltage on the capacitor array. Due to the binary weighting and conventional digital code used, in response to the applied digital input codes, such DACs provide a linear analog output (capacitance).

Some RTCs provide a digital calibration register that can be used to periodically adjust the time of day in discrete amounts. This method does not attempt to alter the crystal behavior, but instead, periodically adjusts the time according to the expected frequency deviation at a specified temperature. The effect is to move the 32.768 kHz parabolic curve up or down in an attempt to approach 0.0 ppm accuracy at a desired temperature. This is accomplished by adding or subtracting clock cycles from the oscillator divider chain. The number of clock pulses removed (subtracted for negative calibration) or inserted (added for positive calibration) is set by the value in the calibration register. By adding clock pulses, time is sped up (the crystal curve moves up). In contrast, by subtracting clock pulses, time is slowed down (the crystal curve moves down).

Another method dynamically changes the load capacitance to "trim" the crystal frequency. One known RTC circuit of this type includes a 6-bit capacitor DAC that provides a delta of 0.5 pF for each code which is used to trim the frequency. In such an arrangement, due to the well known nonlinear frequency to CL relationship, changing CL linearly results in a nonlinear change in frequency. For precision applications requiring better than ±5 ppm precision over a normal operating temperature range, such a non-linear frequency trim arrangement generally cannot meet the requirement.

A linear frequency shift per input code would be desirable as it would provide improved precision. However, due to the nonlinear frequency to CL relationship, the input code vectors would need to be nonlinear and more specifically parabolic to provide a linear frequency shift. Using known methods, this would require nonlinear digital signal processing which can be complex, and also generally requires a large chip area and significant power consumption. Thus, what is needed is a compact, low power RTC circuit which does not require factory calibration and automatically provides a minimal frequency variation over the full RTC operating temperature range, such as within ±5 ppm from −40 to 85° C.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An automatic temperature compensated real-time clock (RTC) chip includes a clock portion having a crystal oscillator block including crystal compensation circuitry adapted to be coupled to a crystal. The crystal compensation circuitry includes a non-linear capacitor DAC including a plurality of load capacitors, wherein the load capacitors have respective switches which switch respective ones of the load capacitors to change a parallel resonance frequency (fp) generated by the oscillator block. The capacitor DAC is arranged so that Analog Trimming (ATR) bits received cause an arrangement of the switches to provide a non-linear change in overall load capacitance to result in a linear relationship between fp and the ATR bits. A temperature sensor block is coupled to the crystal for measuring a temperature of at least the crystal. An A/D converter is coupled to the temperature sensor for outputting a digital temperature signal representative of the temperature of the crystal. A DSP engine receives the digital temperature signal and calculates frequency correction needed to correct for frequency inaccuracy and determines a bit sequence including the ATR bits appropriate to achieve the frequency correction.

The non-linear DAC can comprise a piecewise linear segmented DAC, comprising a plurality of piecewise linear segments connected in parallel. In this embodiment, the plurality of segments can be binary weighted segments. Some of the plurality of segments are controlled by a first number of ATR bits and other of the segments are controlled by a different number of ATR bits. The RTC can further comprise thermometer decoder logic for receiving the ATR bits and generating a plurality of control lines for controlling the switches.

The DSP calculation preferably splits the frequency correction into ATR bits and into coarser Digital Trimming (DTR) bits, wherein the digital trimming bits are operable to perform frequency correction by adding or skipping clock cycles. In this embodiment, the RTC can further comprise an RTC digital trimming module including a clock divider chain for generating a 1 Hz clock from fp, wherein the DTR bits are coupled to an input of the digital trimming module, the digital trimming module performing frequency adjustment on the 1 Hz clock.

The temperature sensor block can comprise a delta Vbe-based temperature sensor (delta Vbe-based temperature sensors are also known in the art as bandgap references). The temperature sensor block can further comprise a PTAT block coupled between the Vbe-based temperature sensor and the A/D converter, wherein process trim (PTR) bits coupled to the PTAT trim at least one of offset and gain for the A/D converter.

RTC and related circuits according to the invention provide low power operation. The RTC chip generally runs at an average current of <1 µA and an average power of <5 µW. In one embodiment, the RTC chip includes a buck voltage regulator for stepping down a supply voltage received by the chip to a lower level. The temperature sensor block can operate with a duty cycle of <1:1,000. The DSP module can be configured exclusive of hardware multipliers. The A/D converter can be a switched-capacitor based A/D converter.

A method for temperature compensating real time clocks comprises the steps of providing a real-time clock (RTC) having a crystal oscillator block comprising a crystal coupled to crystal compensation circuitry. The crystal compensation circuitry comprises a non-linear Capacitor DAC having a plurality of load capacitors having respective switches which switch respective ones of the load capacitors to change a parallel resonance frequency (fp) generated by the oscillator block, wherein the capacitor DAC is arranged so that Analog Trimming (ATR) bits received cause an arrangement of the switches to provide a non-linear change in overall load capacitance resulting in a linear relationship between fp and the ATR bits. The temperature of the crystal is measured. An input code comprising the ATR bits is generated based on the temperature to correct fp. Frequency correction is implemented by applying input code vectors to the Capacitor DAC to provide a frequency shift to temperature correct an oscillator frequency of the crystal oscillator. The linear relationship between fp and the ATR bits can comprise a constant integer/bit, such as 1 ppm/bit. In one embodiment, the generating step comprises generating Digital Trimming (DTR) in addition to the ATR bits, wherein the DTR bits provide a coarser frequency adjustment as compared to the ATR bits and operate by adding or skipping clock cycles derived from the oscillation frequency. A trim frequency resolution of an LSB of the DTR bits can be more than a maximum trim frequency adjustment provided by the ATR bits. The chip can be operated at an average current of <1 µA and an average power of <5 µW. The frequency correcting can comprise continuous non-overlapping frequency adjustment over a range of at least 100 ppm, such as from −63 to 223 ppm.

BRIEF DESCRIPTION OF THE DRAWINGS

A fuller understanding of the present invention and the features and benefits thereof will be accomplished upon review of the following detailed description together with the accompanying drawings, in which:

First, Applicants provide some notation used in the Figures and the detailed description: a capacitor array controlled digitally by input code vectors (DAC or Capacitor DAC); band gap circuit (BGAP), Proportional To Absolute Temperature circuit (PTAT); analog trimming register (ATR); digital trimming register (DTR), and temperature coefficient (TC).

Figure 2B:
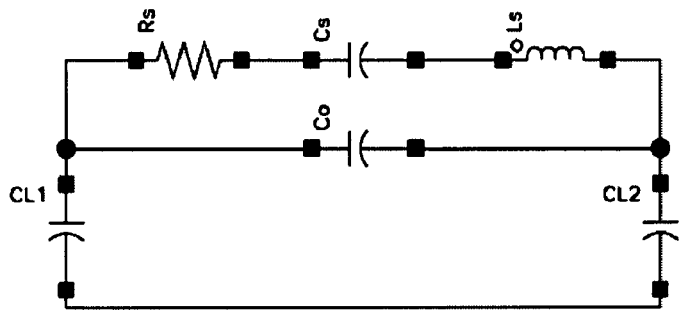

Moreover, although specific numbers of bits are shown for registers shown in the drawings and described herein, the present invention is not limited to the number of bits shown and described for each register.

FIG. 1 shows typical parabolic temperature drift behavior for quartz crystal oscillators used in RTC applications of the tuning fork type.

FIG. 2(a) shows a Pierce Oscillator, which is preferably the oscillator type used with the present invention, while FIG. 2(b) shows the equivalent circuit schematic for a capacitively loaded crystal oscillator, with equations relating the oscillation frequency to the capacitance.

Figure 3A:
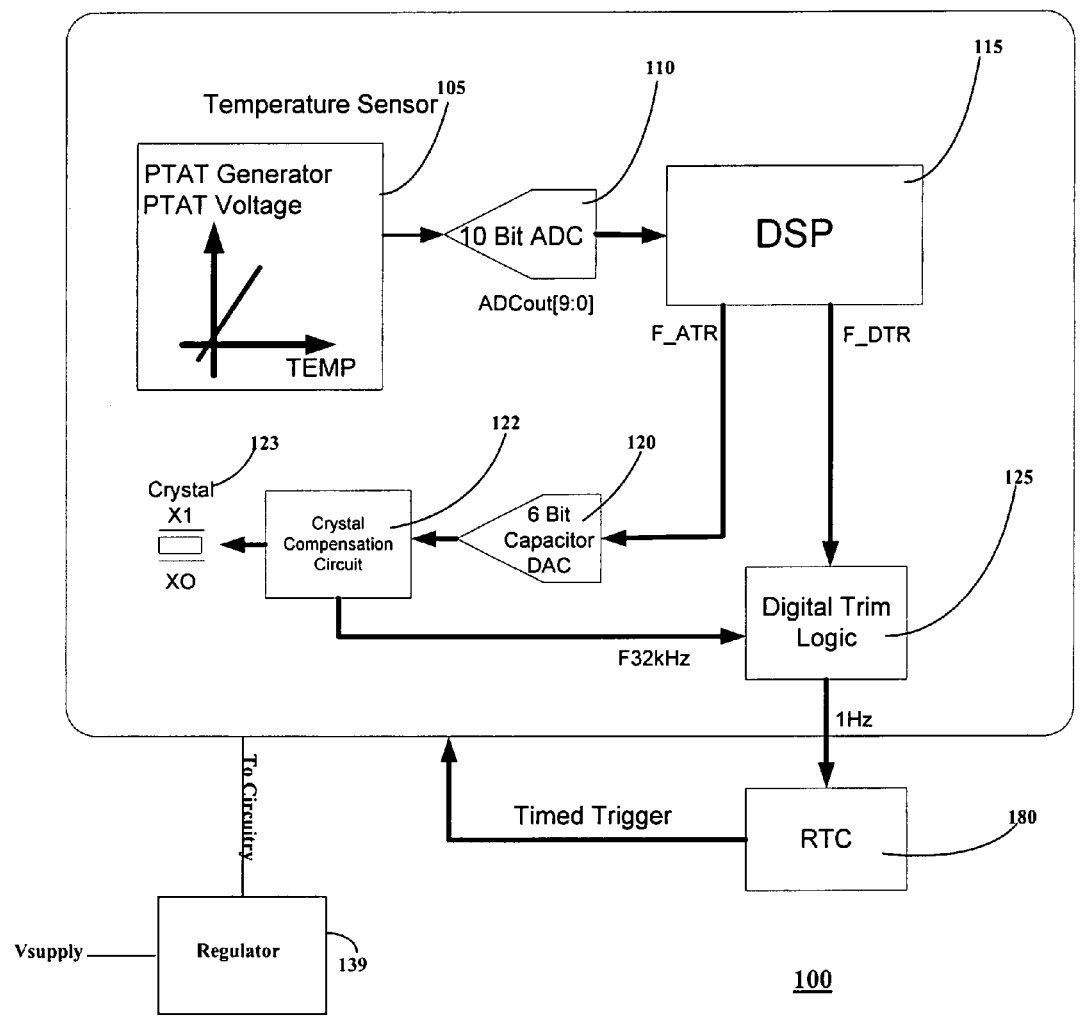
Figure 3B:
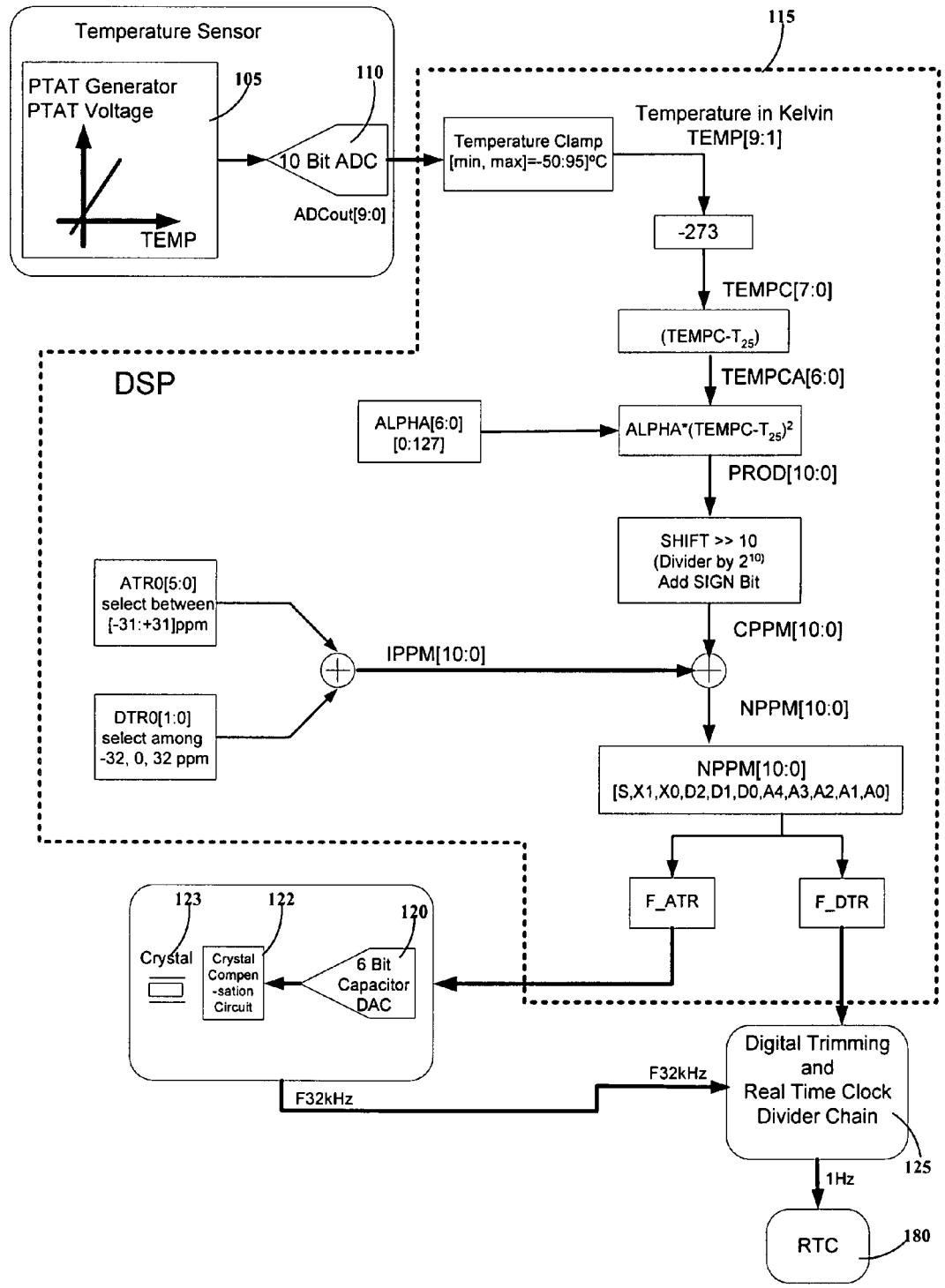

FIG. 3(a) shows a system level schematic for an RTC according to the present invention, while FIG. 3(b) shows a more detailed view of the system shown in FIG. 3(a), showing added exemplary sub-components, registers and bitstreams.

Figure 4A:
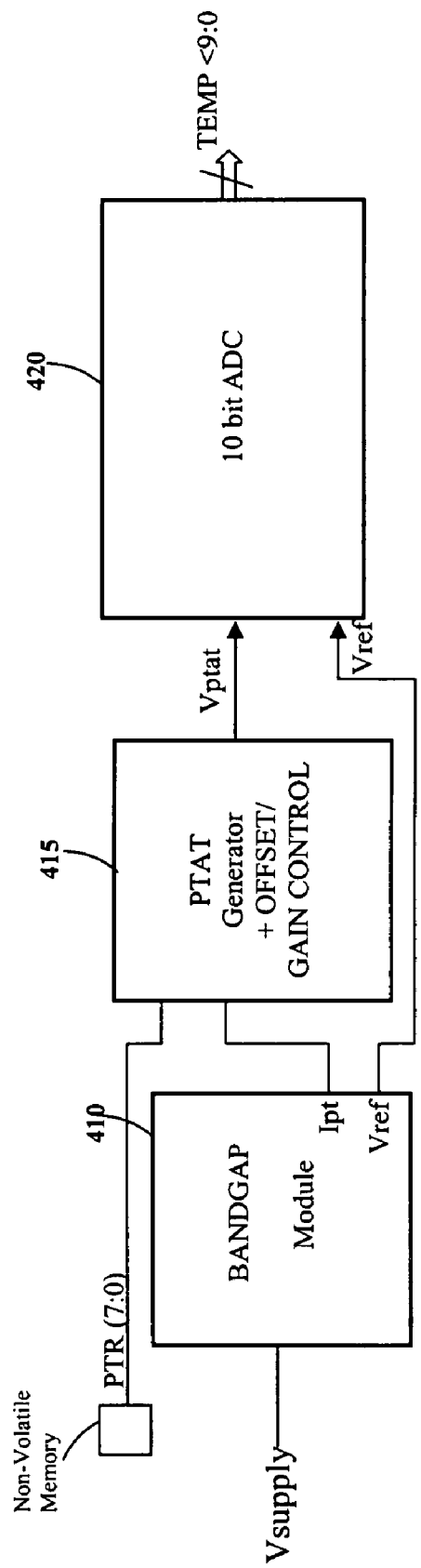

FIG. 4(a) is a schematic of an exemplary temperature sensor for determining the temperature of the crystal, and providing the temperature data in digital form.

Figure 4B:
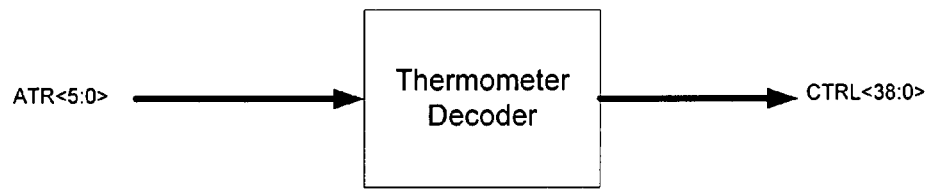

FIG. 4(b) shows a block diagram which explains operation of a thermometer decoder. The thermometer decoder logic is shown receiving the 6 ATR bits and generating 39 control lines for controlling the switches associated with the DAC.

Figure 5A:
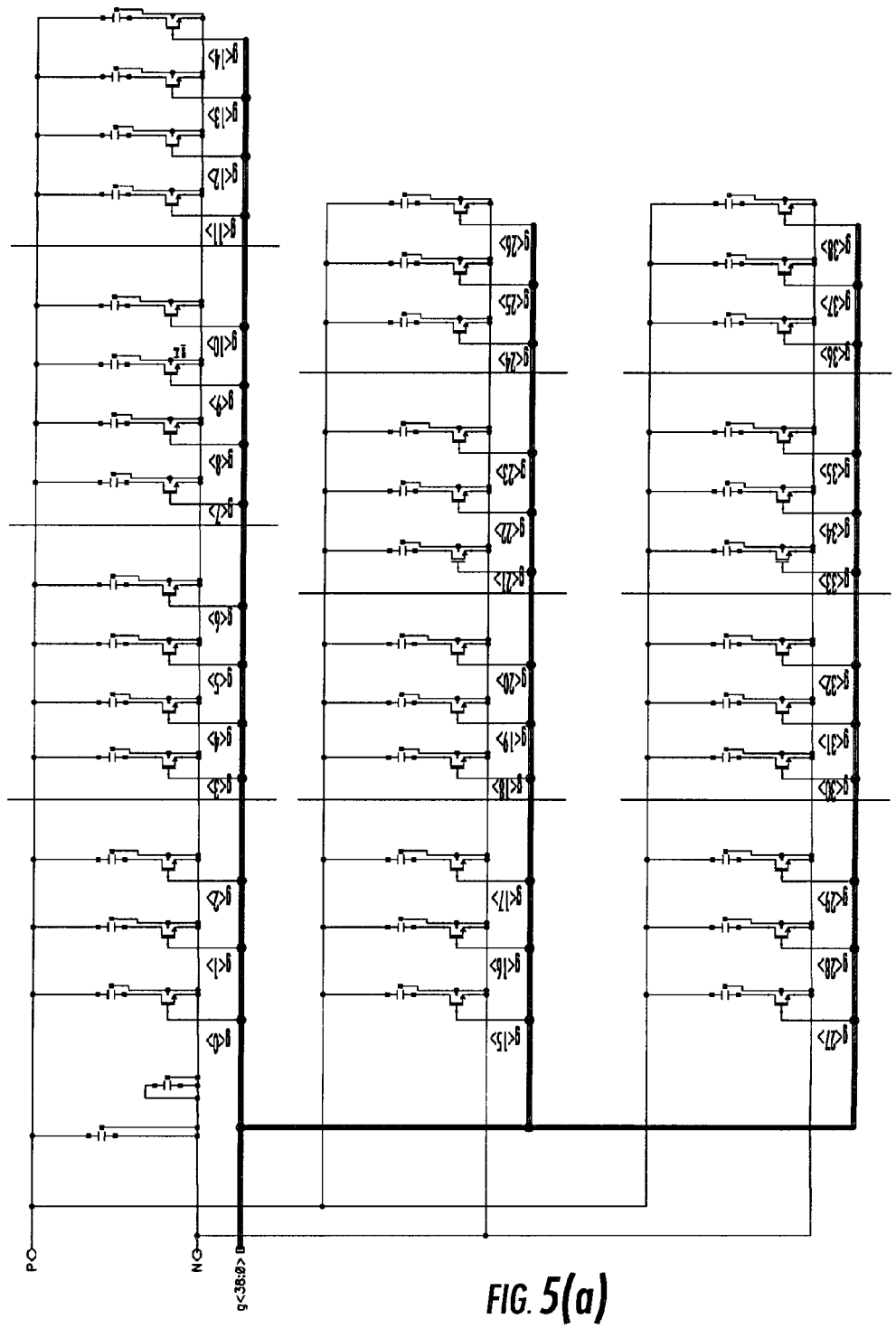

FIG. 5(a) is an exemplary schematic for a non-linear segmented Capacitor DAC according to an embodiment of the invention.

FIG. 5(b) shows a detailed view of each of the 12 capacitor DAC segments along with the control signal level to activate each capacitor, where the transistors associated with the respective capacitors shown in FIG. 5(a) which receive the control signals are shown simply as switches.

Figure 6B:
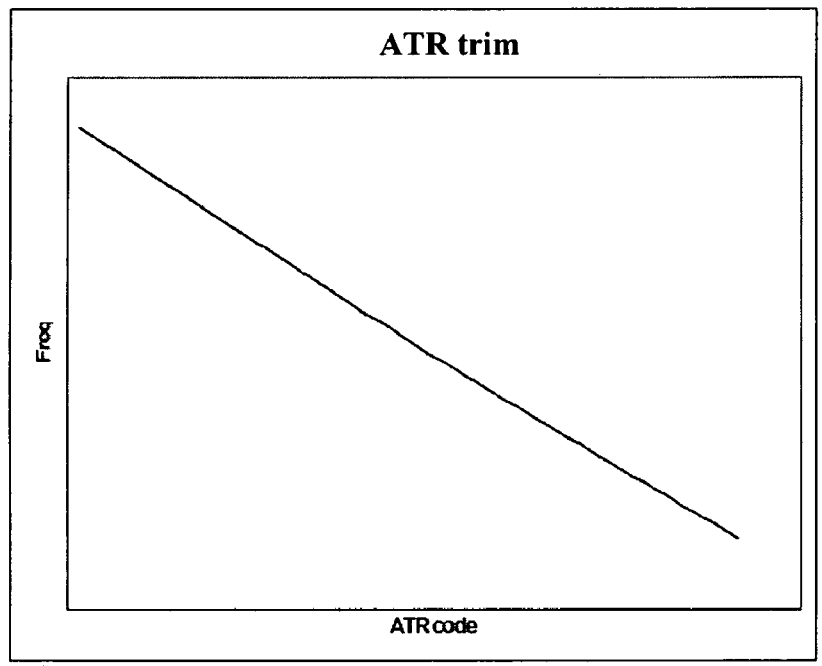
Figure 6C:
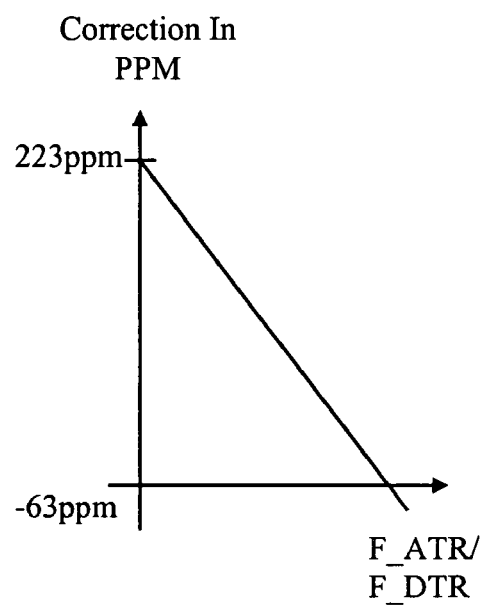

FIG. 6(a) shows trim load capacitance (CL) and resulting parallel resonance frequency (fp) results as a function of ATR trim code for an exemplary Capacitor DAC demonstrating 1 ppm of frequency shift for each ATR bit. FIG. 6(b) compiles data from FIG. 6(a) which clearly demonstrates a linear plot of the resulting fp vs. ATR code. FIG. 6(c) shows continuous non-overlapping ATR/DTR frequency adjustment according to the invention providing adjustment from −63 ppm to 223 ppm.

Figure 7:
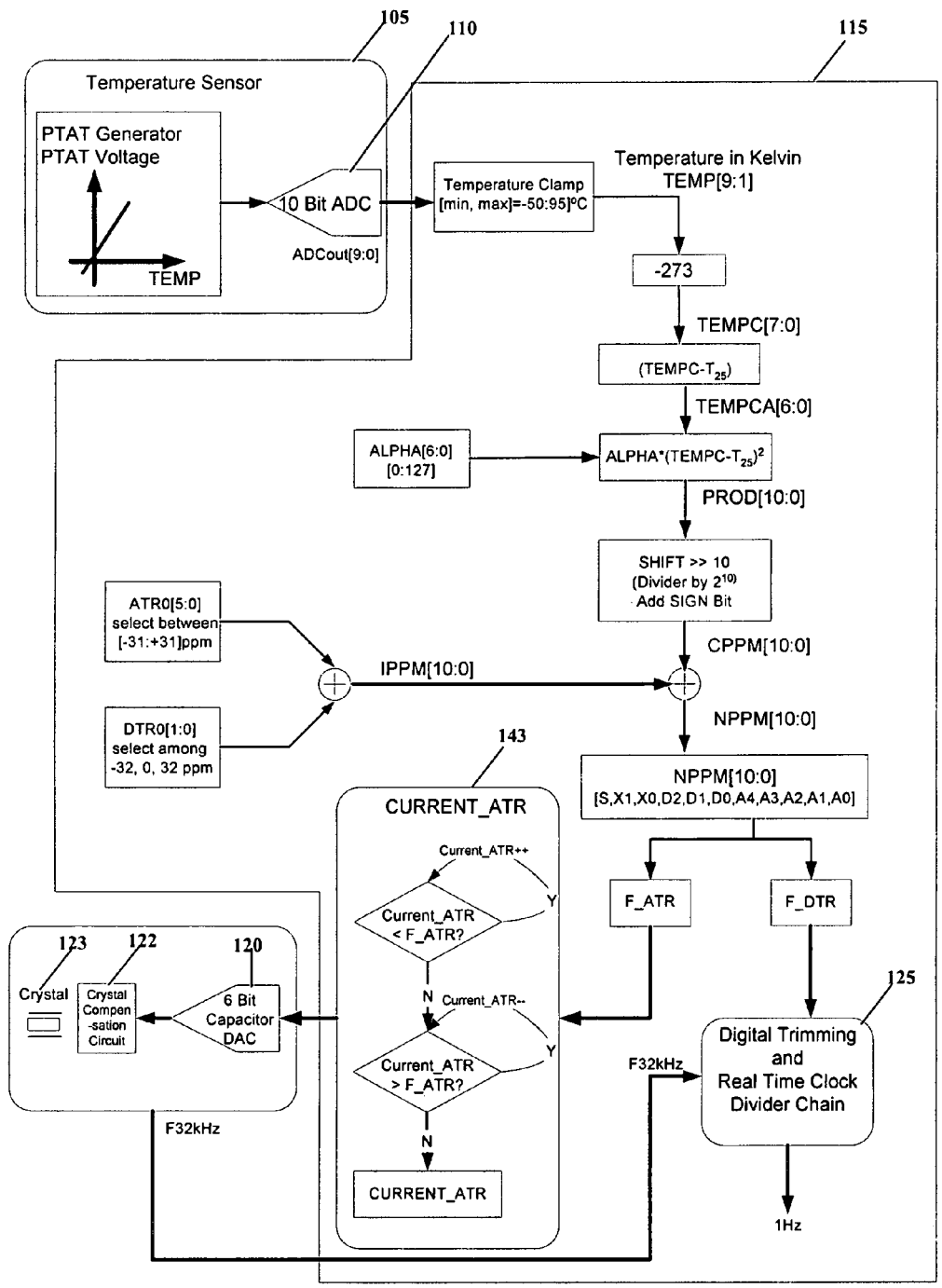

FIG. 7 shows a RTC system showing a gradual crystal frequency correction scheme in the box CURRENT-ATR inserted into the RTC system shown in FIG. 3(b).

Figure 8A:
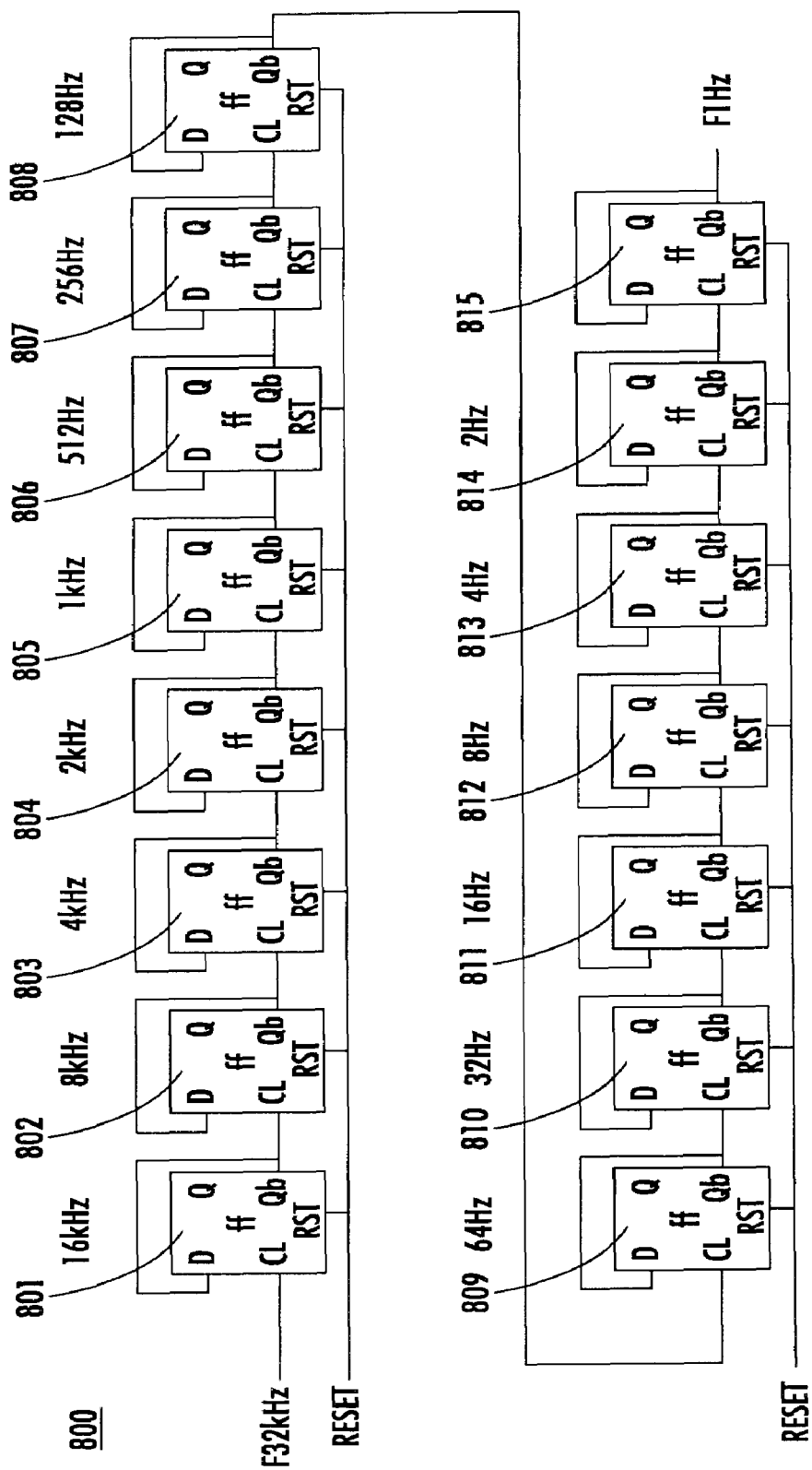
Figure 8B:
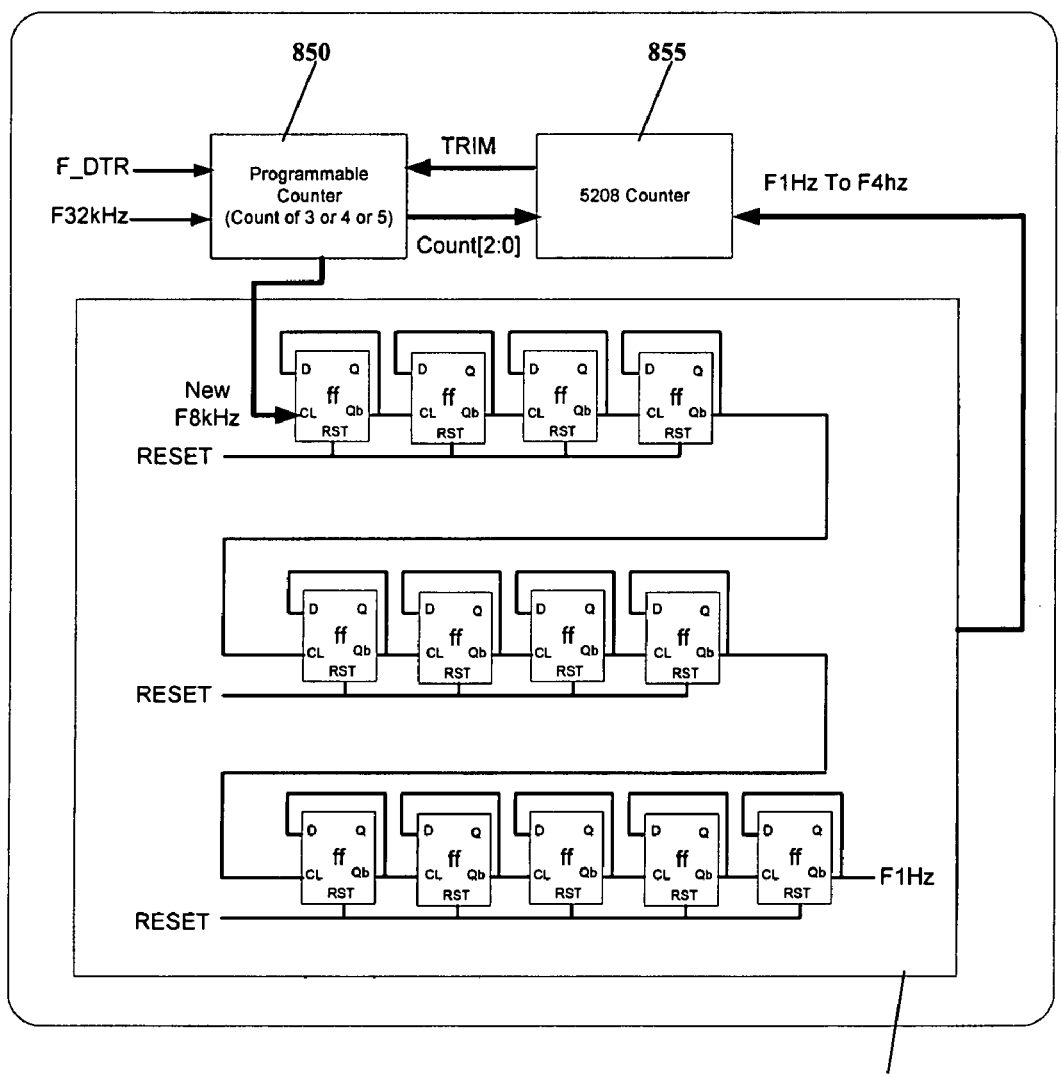
Figure 8C:
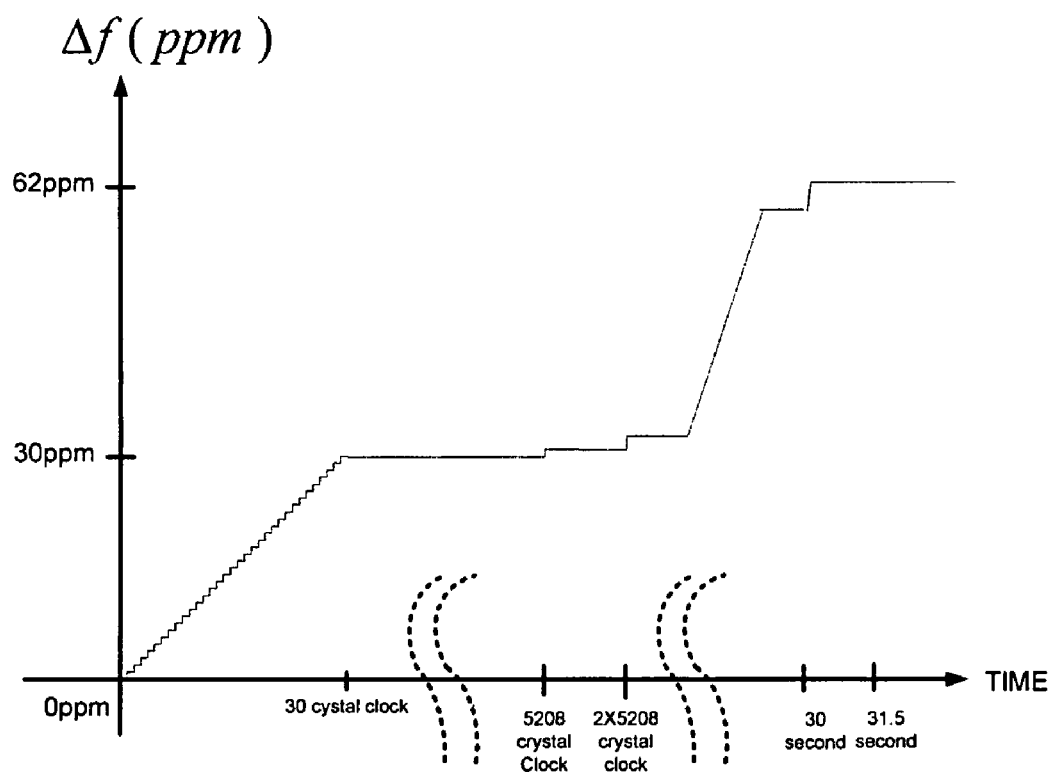

FIG. 8(a) shows an exemplary RTC divider, FIG. 8(b) an exemplary circuitry for implementing a Digital Trimming Process according to the invention, while FIG. 8(c) shows a data simulation demonstrating a gradual and smooth frequency correction using ATR and DTR trimming and the method as described herein.

DETAILED DESCRIPTION

An automatic temperature compensated real time clock (RTC) chip comprises a clock portion including a crystal oscillator block comprising crystal compensation circuitry adapted to be coupled to a crystal, the crystal generally being external to the chip. The compensation circuitry comprises a non-linear capacitor DAC which includes a plurality of load capacitors. The load capacitors have respective switches which switch respective capacitors to change the parallel resonant frequency (fp) provided by the oscillator. The DAC is arranged so that Analog Trimming (ATR) bits received as inputs cause an arrangement of the switches to provide a non-linear change in overall load capacitance, the non-linear change being a parabolic change configured to result in a linear relationship between fp and the number of ATR bits.

An on-chip temperature sensor block is coupled to the crystal for measuring a temperature of the crystal. An A/D converter is coupled to the temperature sensor for outputting a digital signal representative of the temperature of the crystal. A DSP engine receives the digital signal representative of the temperature and calculates the frequency correction needed determines a bit sequence of ATR bits, and optionally DTR bits as described below, to achieve frequency correction. Although the present invention is generally described relative to a quartz crystal which has provides a nominal oscillation frequency of about 32.768 kHz, the present invention can operate with other crystal types which operate at other nominal oscillation frequencies.

RTC chips according to the present invention are very low power, generally drawing a supply current of less than 1 μa. Preferably, the ADC used with the present invention is a low power ADC. For example, the switched-capacitor based ADC disclosed in a paper by Onodera et al. entitled "A Cyclic A/D Converter That does not Require Matched Components", IEEE JNL of Solid-State Circuits, Vol. 23, No. 1, February 1988 can be used. However, other ADC designs may be used with the present invention, preferably being low power designs.

Several other aspects of the present invention significantly contribute to low power aspect of the present invention. The RTC logic described below is preferably run at a low frequency, such as 32.768 kHz. An on-chip voltage regulator is also preferably provided, for example, so that a higher supply voltage received by the chip, such as a VCC of 2.7 to 5.5 volts, is stepped down to a lower voltage, such as 2.4 volts, for use on the RTC chip. Channel lengths of RTC logic gates can also designed to have comparatively long channel lengths to decrease the magnitude of shoot through currents. The temperature sensor is also preferably designed to have a very low duty cycle. Specifically, in one embodiment, the temperature sensor initiates temperature sampling which lasts around 1 msec, or less, with the sampling occurring for example, only once every minute. The capacitor DAC is also configured to consume essentially no DC power because capacitors do not carry steady DC current. The DTR circuitry which in one embodiment implements the DSP algorithm together with ATR bits is also preferably configured without any hardware multipliers or other power hungry circuitry. The DSP is a lower power module because the DSP algorithm is implemented using hard-wired blocks (as opposed to programmable blocks) which results in much smaller gate count, intermediate signals are bussed, and its speed is optimized for low power application.

FIG. 2(a) shows a Pierce Oscillator which is preferably the oscillator type used with the present invention. Related FIG. 2(b) shows the equivalent circuit schematic for a capacitively loaded crystal oscillator, with equations which relate oscillation frequency to the capacitance. The Pierce Oscillator includes an external crystal oscillator and an associated bias network which includes load capacitors. Although the present invention is described using a Pierce Oscillator, the present invention can use any LC-based oscillator or crystal-based oscillator. Significantly, the parallel resonant frequency, fp, for a Pierce Oscillator, has an inverse square root relationship to load capacitor ($C_L$) changes.

The invention obtains accurate crystal temperature data on the RTC chip, and uses the temperature data to automatically correct the oscillator frequency as the temperature changes. An on-chip temp sensor, an A/D to digitize the analog sensed temperature data and a DSP algorithm to provide crystal correction based on a stored frequency deflection relationship with temperature for the associated crystal, are preferably all implemented on the same chip, such as a Si chip. As noted above, crystal oscillators use load capacitors to adjust their parallel resonance frequency, fp, and the fp for a Pierce Oscillator has an inverse square root relationship to load capacitor (CL) changes.

The invention uses an on-chip load capacitor array which is controlled digitally by input code vectors. As noted above, such capacitor arrays are referred to herein as Capacitor DACs and inputs to the Capacitor DACs as ATR bits and optionally also DTR bits. Due to the well known nonlinear frequency (fp) to CL relationship provided by a Pierce Oscillator, to achieve a desired linear frequency shift per ATR bit requirement, a non-linear input code can be used. However, as noted in the Background, the generation of a non-linear input code generally requires nonlinear digital signal processing, which is fairly complex. By instead providing a non-linear capacitor DAC according to the invention, the desired linear frequency shift per ATR bit requirement is provided without the need for a non-linear input code. In a preferred embodiment, the nonlinear capacitor DAC is implemented using a plurality of piecewise linear segments. This frequency control is generally used for automatic crystal frequency compensation against temperature variation. A prototype device was found to provide frequency correction within ±5 ppm over the full temperature range from −50 to 95° C.

To achieve a linear step size of frequency shift, such as a constant integer number (e.g. 1) ppm of frequency shift for each ATR bit, CL is changed in non-linear parabolic manner. Accordingly, for capacitor DACs according to the present invention, the capacitor DACs are arranged so that ATR bits produce nonlinear parabolic changes in the value of CL, wherein the parabolic change results into linear frequency shifts (see FIG. 6(b) described below). In one embodiment, the shift is a constant integer number/bit, such as a 1 ppm/bit step size.

FIG. 3(a) shows a system level schematic for an RTC system 100 according to the present invention. An on-chip temperature sensor block including a PTAT generator 105 is coupled to the crystal 123 for measuring a temperature of the crystal. ADC 110 is shown as a 10 bit ADC coupled to the PTAT 105 for outputting a digital temperature signal representative of the temperature of the crystal. A DSP engine 115 receives the digital temperature signal. The DSP engine calculates the frequency correction needed to correct for frequency inaccuracy and determines one or more bit sequences to achieve the desired frequency correction. As shown in FIG. 3(a), DSP 115 preferably outputs both ATR bits and another bit sequence referred to herein as digital trimming (DTR) bits to implement the correction. The frequency correction is thus split with the ATR bits being used for fine correction, while the DTR bits are for coarse correction. The DTR bits can also be used to trim the offset of the ADC 110 converter, the gain for ADC 110, or both the offset and the gain.

As shown in FIG. 3(a), one output of DSP 115 is F_ATR which is 6 bits, with the 6 ATR bits coupled to 6 bit Capacitor DAC 120, which is coupled to crystal compensation circuit 122, which is coupled to crystal 123. Another output from DSP 115 is DTR bits shown as F_DTR. The DTR bits are coupled to digital trim logic 125. Digital trim logic 125 is shown receiving a 32 khZ signal from crystal compensation circuit 122, and outputs a 1 Hz signal to RTC 180. FIG. 3(b) shows a more detailed view of the system shown in FIG. 3(a), showing added exemplary sub-components, registers and bitstreams. In one low power implementation, buck voltage regulator 139 is shown. Buck regulator 139 steps down supply voltage received by the chip to a lower level and provides the stepped down supply voltage to the various circuitry on the chip.

In a preferred embodiment, a six bit ATR output by DSP 115, ATR<5:0>, changes the on-chip CL for the crystal to change its center frequency in a constant fine resolution of 1 ppm/code. Thus, the six bit ATR can change crystal frequency over +/−32 ppm range in 1 ppm steps. In one embodiment, the DTR is 3 bits, DTR<2:0> which change the crystal frequency digitally by adding or swallowing some clock pulses, such as every second. As described below, DTR is a relatively coarse control with an exemplary range of −32 ppm to +192 ppm, with 32 ppm step size.

The ATR bits are applied to a non-linear Capacitor DAC according to the invention 120. Capacitor DAC 120 is coupled to the crystal compensation circuitry 122 which is coupled to the crystal 123. The DTR bits are applied to digital trim logic 125 including a clock divider chain for generating a 1 Hz clock, wherein the DTR bits are coupled to an input the digital trimming module, the digital trimming module performing frequency adjustment on a 1 Hz clock derived from fp as described in more detail below.

FIG. 4(a) is a schematic of an exemplary temperature sensor 400 for determining the temperature of the crystal, and providing the temperature data in digital form. A bandgap reference 410 is shown coupled to PTAT 415 which is coupled to the ADC 420, shown as a 10 bit ADC. The ADC offset and gain deviations from ideal values are corrected by Process Trim (PTR) bits in the PTAT Generator block 415 as explained below.

PTR(7:0) bits are input to PTAT 415. ADC 420 has inputs Vptat and Vref. The 10 bit ADC 420 output is given by 1024*Vptat/Vref. The Vptat signal ideally should be proportional to Temperature with no DC offset, such that:

$$Vptat(ideal) = Ideal\_Gain\_Constant * Temperature$$

However, the actual (non-ideal) Vptat signal is as follows:

$$Vptat(actual) = Gain * Temperature + Offset$$

Thus, PTR(7:0) bits can be used in the present invention to add/subtract dc signals from Vptat (actual) to null out "Offset" voltage as well as correct the "Gain" coefficient to "Ideal_Gain_Constant" value. After Offset and Gain corrections, ADC 420 advances by 2 LSB for each 1 deg C. or:

$$ADC(\text{Code in Decimal}) = 2*(Temperature + 273)$$

PTR bits can be set by the test program thru a Serial Interface to the RTC chip. In one arrangement, the test program checks ADC codes at 2 different known temperatures and calculates Gain and Offset trim bit values. These PTR(7:0) bits can then be stored permanently inside the chip using a non volatile memory, such as an EE memory register.

FIG. 4(b) shows a block diagram which explains operation of a thermometer decoder 450. The thermometer decoder 450 is shown receiving the 6 ATR bits and generating 39 control lines for controlling the respective switches associated with the Capacitor DAC according to the present invention.

FIG. 5(a) is an exemplary schematic for a non-linear segmented Capacitor DAC according to an embodiment of the invention showing connection to a <38:0> control signal. FIG. 5(b) shows a detailed view of each of the 12 capacitor DAC segments along with the control signal level to activate each capacitor, where the transistors associated with the respective capacitors shown in FIG. 5(a) which receive the control signals are shown in simplified functional form as switches. The <38:0> control signal can be provided by the thermometer decoder shown in FIG. 4(b). Unlike conventional Capacitor DACS, the capacitor DAC segments shown in FIG. 5(b) are not binary weighted relative to one another. Note also that some DAC segments have three (3) associated capacitors (segments 1 and 6-12), while some segments have four (4) associated capacitors (segments 2-4).

FIG. 6(a) shows trim load capacitance (CL) and resulting parallel resonance frequency (fp in Hz) results as a function of ATR trim code for an exemplary Capacitor DAC according to the present invention demonstrating 1 ppm (1 ppm=0.037 Hz) of frequency shift for each ATR bit. Significantly, the delta CL for the Capacitor DAC is non-linear with respect to ATR bits, with the non-linearity being parabolic in nature and shaped to replicate the fp to CL relationship of the crystal. The result is a constant 1 ppm of frequency shift for each ATR bit. FIG. 6(b) compiles data from FIG. 6(a) which clearly demonstrates a linear plot of the resulting fp (y-axis) vs. ATR code (x-axis).

A simplified flow chart for the present invention can be described as follows: The user measures Fout provided by a pin on the RTC chip at room temperature and inputs ATR0, DTR0 for initial accuracy, or to compensate for crystal aging. On the circuit, the following data sequence automatically occurs:

band gap (BGAP) Ref+PTAT→10 bit ADC→Junction Temp (e.g. in Kelvin)→crystal TC LOGIC→F_ATR and F_DTR→NonLinear DACs of crystal Oscillator→temperature compensated fp.

Another inventive aspect of the present invention relates to a new frequency trim algorithm and implementing circuitry. As noted in the background, a typical stability of a crystal can be described by equation (1), repeated below.

$$\Delta f = \Delta f_i + \alpha (T - T_{25})^2 \quad (1)$$

In order to compensate the initial frequency error $\Delta f_i$, the present invention can use initial trim registers, such as an Initial Digital Trimming Register (DTR0) and the Initial Analog Trimming Register (ATR0). The user can measure Fout provided by a pin on the RTC chip at room temperature and input ATR0, DTR0 which corrects for initial accuracy, or sometime later to compensate for crystal aging. These two registers are used to program the initial frequency correction term IPPM.

As noted above, the trimming preferably splits the frequency correction into two portions, referred to herein as ATRs and DTRs, the coarser DTRs minimizing the chip area needed for phase adjustment on the crystal. Digital trimming which is based on adding or swallowing (omitting) some pulses from the crystal compensation circuitry is a technique that has been applied to previous generations of RTC chips. However, the combination of ATR and DTR according to the present invention which provides continuous, non-overlapping frequency adjustment was unknown prior to the present invention. For example, FIG. 6(c) shows continuous non-overlapping ATR/DTR frequency adjustment according to the invention providing adjustment from −63 ppm to 223 ppm. The continuous gradual non-overlapping frequency adjustment shown minimizes the disturbance that occur on the crystal and the rest of the clock system on the RTC chip using known correction schemes.

As described above, the initial Digital Trimming Register (DTR0) and Initial Analog Trimming Register (ATR0) can be used to program the initial frequency correction term IPPM. The frequency correction (in ppm) corresponding to these registers are shown on Table 1 and Table 2 below.

TABLE 1

Initial Exemplary Digital Trimming Register and corresponding frequency correction

| DTR0 | PPM |
| --- | --- |
| 00 | 0 ppm |
| 01 | +32 ppm |
| 10 | 0 ppm |
| 11 | −32 ppm |

TABLE 2

Initial Exemplary Analog Trimming Register and corresponding frequency correction

| ATR0 CODE | PPM |
| --- | --- |
| 000000 | 32 |
| 000001 | 31 |
| 000010 | 30 |
| 000011 | 29 |
| 000100 | 28 |
| 000101 | 27 |
| 000110 | 26 |
| 000111 | 25 |
| 001000 | 24 |
| 001001 | 23 |
| 001010 | 22 |
| 001011 | 21 |
| 001100 | 20 |
| 001101 | 19 |
| 001110 | 18 |
| 001111 | 17 |
| 010000 | 16 |
| 010001 | 15 |
| 010010 | 14 |
| 010011 | 13 |
| 010100 | 12 |
| 010101 | 11 |
| 010110 | 10 |
| 010111 | 9 |
| 011000 | 8 |
| 011001 | 7 |
| 011010 | 6 |
| 011011 | 5 |
| 011100 | 4 |
| 011101 | 3 |
| 011110 | 2 |
| 011111 | 1 |
| 100000 | 0 |
| 100001 | −1 |
| 100010 | −2 |
| 100011 | −3 |
| 100100 | −4 |
| 100101 | −5 |
| 100110 | −6 |
| 100111 | −7 |
| 101000 | −8 |
| 101001 | −9 |
| 101010 | −10 |
| 101011 | −11 |
| 101100 | −12 |
| 101101 | −13 |
| 101110 | −14 |
| 101111 | −15 |
| 110000 | −16 |
| 110001 | −17 |
| 110010 | −18 |
| 110011 | −19 |
| 110100 | −20 |
| 110101 | −21 |
| 110110 | −22 |
| 110111 | −23 |
| 111000 | −24 |
| 111001 | −25 |
| 111010 | −26 |
| 111011 | −27 |

TABLE 2-continued

Initial Exemplary Analog Trimming Register and corresponding frequency correction

| ATR0 CODE | PPM |
|---|---|
| 111100 | −28 |
| 111101 | −29 |
| 111110 | −30 |
| 111111 | −31 |

Also as described above, referring again to FIG. 3(b), the PTAT generator and exemplary 10 bit ADC can be used to build a temperature sensor, which gives the measurement of the temperature on the RTC chip. 9 MSB bits can be used to represent the temperature in Kelvin. This ADC output is then preferably clamped and converted into Celsius (TEMPC), within the temperature range from −50° C. to 95° C.

To convert the parabolic curvature constant α into binary code, a 7 bit register (ALPHA) can be used, where $$ALPHA = \alpha \cdot 1024 \quad (2)$$

The ALPHA register can be in the value of 33 hex.

The DSP will then compute the product term PROD and temperature/crystal dependent correction term CPPM, where $$PROD = ALPHA \cdot (T - T_{25})^2 \quad (3)$$

and $$CPPM = \frac{ALPHA \cdot (T - T_{25})^2}{1024} \quad (4)$$

The final frequency correction needed, the Net PPM (NPPM), is then given by $$NPPM = IPPM + CPPM \quad (5)$$

The NPPM is an 11 bit register, and it is in the structure as shown below, $$NPPM = [S, X1, X0, D2, D1, D0, A4, A3, A2, A1, A1] \quad (6)$$

Where:

S=Sign Bit; Indicates the direction of correction

[X1,X0]=Extra Bits; If either one of them is at Logic High (1), it means that the Net PPM desired has been outside the correction limit, which in the embodiment described herein is within −63 ppm to +223 ppm.

Because of the above-described NPPM structure, the NPPM bits can be simply distributed into Final Digital Trimming Register (F_DTR) and Final Analog Trimming Register (F_ATR), respectively. FIG. 7 shows a RTC system showing a gradual crystal frequency correction scheme in the box CURRENT_ATR 143 inserted into the RTC system shown in FIG. 3(b). As seen in FIG. 7, the crystal compensation circuit output (F32 kHz clock), is the clock fed into the divider chain (within the digital trim logic) to generate the 1 Hz signal for the RTC application.

Regarding analog trimming and CURRENT_ATR 143, the F_ATR is the final input that is applied to the 6 bit capacitor DAC, which modulates the oscillating frequency of the crystal. For a 6 bit F_ATR trimming 1 ppm/bit, the F_ATR provides frequency trimming between the ranges of ±32 ppm, as shown in Table 2 above.

In order to minimize the disturbance on the crystal and crystal compensation circuit, in a preferred embodiment of the invention the CURRENT_ATR is directly connected to the DAC. Once the F_ATR has been computed, the CURRENT_ATR will move toward the F_ATR gradually, such as with one ppm per crystal clock, until CURRENT_ATR is equal to the F_ATR. In the extreme case, it takes 64 crystal clocks to complete such adjustment. This new technique provided smooth phase modulation for the crystal and avoids overshoot.

Regarding digital trimming for RTC, as described above, the crystal can suffer from frequency fluctuation of up to 200 ppm over the operating temperature range. However, it is extremely costly in terms of chip area to correct such a wide frequency variation by using conventional ATR trimming. In a preferred embodiment, ATR trimming is preferably limited among the frequency correction of ±32 ppm, while the rest of the correction, up to the range of 192 ppm, is implemented by utilizing the DTR function. The effect of exemplary F_DTR trimming is shown in Table 3 below.

TABLE 3

Exemplary F_DTR and corresponding frequency correction

| F_DTR | PPM |
|---|---|
| 000 | 0 ppm |
| 001 | +32 ppm |
| 010 | +64 ppm |
| 011 | +96 ppm |
| 100 | +128 ppm |
| 101 | +160 ppm |
| 110 | +192 ppm |
| 111 | −32 ppm |

Since the RTC ticks on the 1 Hz frequency, the RTC includes a divider chain to generate the 1 Hz clock, with an exemplary frequency divider 800 being shown in FIG. 8(a). Frequency divider 800 includes fifteen D flip-flops 801 to 815 coupled in series to divide down the 32 kHz input to 1 Hz by dividing by 2 fifteen times ($2^{15}=32,768$).

DTR correction is frequency correction that is applied to clock F1Hz circuitry. To speed up the F1Hz, the circuit should count faster in the divider chain by counting a single F32 kHz cycle twice. While to slow down the F1Hz, the circuit should skip a count of an F32 kHz cycle. This is implemented according to an embodiment of the invention as shown as DTR circuitry 840 in FIG. 8(b) by replacing the first two flip-flops of the divider chain shown in FIG. 8(a) by a programmable counter 850, which count among 3, 4 or 5, depending on the F_DTR registers. The programmable counter generates the new F8 kHz clock and feeds it into the rest of the divider chain 860. a 5208 counter 855 is interfaced with divider chain 860 and programmable counter 850.

Again, to achieve smooth frequency adjustment, and also to achieve a large correction range, such as up to 192 ppm, the frequency trimming adjustment is performed gradually by distributing the trim among the 1 million cycles of F32 kHz. This means that every 5208 (1 million/192) cycles of F32 kHz clock, a trimming will happen, depending on the input of F_DTR. This is depicted in FIG. 8(b).

As an example, FIG. 8(c) shows a smooth correction provided by the invention for a case where the F_ATR gives a correction of +30 ppm; and F_DTR gives the correction of +32 ppm. After finishing the computing of F_ATR and F_DTR, the DSP moves the CURRENT_ATR in every crystal clock until the CURRENT_ATR reach the desired F_ATR value of +30 ppm. Then the DSP fine tunes the divider chain every 5,208 crystal clocks to accomplish the rest of the correction.

Although the present invention is described herein applied to an RTC circuit, the invention can be used in a variety of other products, including clock synthesizers, phase lock loops, crystal oscillators, and other timing products. The low power aspect of the present invention, generally requiring no more than 1 μa at 2.4 volts for implementation as an RTC, for example, makes the present invention highly desirable for many applications because of the ability to limit the battery backup power supply required.

In the preceding description, certain details are set forth in conjunction with the described embodiment of the present invention to provide a sufficient understanding of the invention. One skilled in the art will appreciate, however, that the invention may be practiced without these particular details. Furthermore, one skilled in the art will appreciate that the example embodiments described above do not limit the scope of the present invention and will also understand that various modifications, equivalents, and combinations of the disclosed embodiments and components of such embodiments are within the scope of the present invention.

Moreover, embodiments including fewer than all the components of any of the respective described embodiments may also within the scope of the present invention although not expressly described in detail. Finally, the operation of well known components and/or processes has not been shown or described in detail below to avoid unnecessarily obscuring the present invention.

One skilled in the art will understood that even though various embodiments and advantages of the present Invention have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate may be realized through software executing on suitable processing circuitry. The present invention is to be limited only by the appended claims.

It is to be understood that while the invention has been described in conjunction with the preferred specific embodiments thereof, that the foregoing description as well any examples provided are intended to illustrate and not limit the scope of the invention. Other aspects, advantages and modifications within the scope of the invention will be apparent to those skilled in the art to which the invention pertains.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

We claim:

1. An automatic temperature compensated real-time clock (RTC) chip, comprising:
    a clock portion including a crystal oscillator block comprising crystal compensation circuitry adapted to be coupled to a crystal, said crystal compensation circuitry comprising a non-linear capacitor DAC including a plurality of load capacitors, said load capacitors having respective switches which switch respective ones of said load capacitors to change a parallel resonance frequency (fp) generated by said oscillator block, wherein said capacitor DAC is arranged so that Analog Trimming (ATR) bits received cause an arrangement of said switches to provide a non-linear change in overall load capacitance to result in a linear relationship between said fp and said ATR bits;
    a temperature sensor block coupled to said crystal for measuring a temperature of at least said crystal;
    an A/D converter coupled to said temperature sensor for outputting a digital temperature signal representative of said temperature of said crystal, and
    a DSP engine for receiving said digital temperature signal, said DSP engine calculating frequency correction needed to correct for frequency inaccuracy and determining a bit sequence comprising said ATR bits to achieve said frequency correction.

2. The RTC of claim 1, wherein said non-linear DAC comprises a piecewise linear segmented DAC, comprising a plurality of piecewise linear segments connected in parallel.

3. The RTC of claim 2, wherein said plurality of segments are binary weighted segments.

4. The RTC of claim 2, wherein some of said plurality of segments are controlled by a first number of said ATR bits and other of said plurality of segments are controlled by a different number of said ATR bits.

5. The RTC of claim 1, further comprising thermometer decoder logic for receiving said ATR bits and generating a plurality of control lines for controlling said switches.

6. The RTC of claim 1, wherein said DSP calculation splits said frequency correction into said ATR bits and into coarser Digital Trimming (DTR) bits, wherein said digital trimming bits are operable to perform frequency correction by adding or skipping clock cycles.

7. The RTC of claim 6, further comprising a RTC digital trimming module including a clock divider chain for generating a 1 Hz clock from said fp, wherein said DTR bits are coupled to an input of said digital trimming module, wherein said digital trimming module performs said frequency adjustment on said 1 Hz clock.

8. The RTC of claim 1, wherein said temperature sensor block comprises a delta Vbe-based temperature sensor.

9. The RTC of claim 8, wherein said temperature sensor block further comprises a PTAT block coupled between said Vbe-based temperature sensor and said A/D converter, wherein process trim (PTR) bits coupled to said PTAT trim at least one of offset and gain for said A/D converter.

10. The RTC of claim 1, wherein said chip runs at an average current of <1 μA and an average power of <5 μW.

11. The RTC of claim 10, further comprising a buck voltage regulator on said chip for stepping down a supply voltage received by said chip to a lower level.

12. The RTC of claim 1, wherein said temperature sensor block operates with a duty cycle of <1:1,000.

13. The RTC of claim 7, wherein said DSP engine is configured exclusive of hardware multipliers.

14. The RTC of claim 7, wherein said A/D converter is a switched-capacitor based A/D converter.

15. A method for temperature compensating a real time clock (RTC) circuit, comprising the steps of:
    providing a real-time clock (RTC) having a crystal oscillator block comprising a crystal coupled to crystal compensation circuitry, said crystal compensation circuitry comprising a non-linear Capacitor DAC having a plurality of load capacitors having respective switches which switch respective ones of said load capacitors to change a parallel resonance frequency (fp) generated by said oscillator block, wherein said capacitor DAC is arranged so that Analog Trimming (ATR)

bits received cause an arrangement of said switches to provide a non-linear change in overall load capacitance resulting in a linear relationship between said fp and said ATR bits;

measuring a temperature of said crystal;

generating an input code comprising said ATR bits based on said temperature to correct said fp, and frequency correcting by applying said input code as said input code vectors to said Capacitor DAC to provide a frequency shift to temperature correct an oscillator frequency of said crystal oscillator.

16. The method of claim 15, wherein said linear relationship comprises a constant integer/bit.

17. The method of claim 15, wherein said generating comprises generating Digital Trimming (DTR) in addition to said ATR bits, wherein said DTR bits provide a coarser frequency adjustment as compared to said ATR bits and are operable by adding or skipping clock cycles derived from said oscillation frequency.

18. The method of claim 17, wherein a trim frequency resolution of an LSB of said DTR bits is more than a maximum trim frequency adjustment provided by said ATR bits.

19. The method of claim 15, wherein said RTC runs at an average current of <1 μA and an average power of <5 μW.

20. The method of claim 15, wherein said frequency correcting comprises continuous non-overlapping frequency adjustment over a range of at least 100 ppm.

* * * * *